United States Patent
Moll et al.

(10) Patent No.: US 8,889,022 B2
(45) Date of Patent: Nov. 18, 2014

(54) METHODS OF FORMING ASYMMETRIC SPACERS ON VARIOUS STRUCTURES ON INTEGRATED CIRCUIT PRODUCTS

(71) Applicant: GLOBALFOUNDRIES Inc., Grand Cayman (KY)

(72) Inventors: Hans-Peter Moll, Dresden (DE); Joachim Patzer, Langebruck (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/781,874

(22) Filed: Mar. 1, 2013

(65) Prior Publication Data
US 2014/0248778 A1    Sep. 4, 2014

(51) Int. Cl.
*B44C 1/22*    (2006.01)
*H01L 21/02*    (2006.01)

(52) U.S. Cl.
CPC .............................. *H01L 21/02107* (2013.01)
USPC ................. 216/62; 216/37; 438/305; 257/386

(58) Field of Classification Search
USPC .................... 216/37, 62; 438/305; 257/386
See application file for complete search history.

(56) References Cited

U.S. PATENT DOCUMENTS

| | | | | |
|---|---|---|---|---|
| 6,794,256 | B1 * | 9/2004 | Fuselier et al. | 438/286 |
| 7,354,839 | B2 * | 4/2008 | Wei et al. | 438/305 |
| 8,138,029 | B2 * | 3/2012 | Zhu et al. | 438/149 |
| 8,158,482 | B2 * | 4/2012 | Hoentschel et al. | 438/286 |
| 2007/0080401 | A1 | 4/2007 | Yang | |
| 2008/0185662 | A1 | 8/2008 | Yang | |
| 2012/0171830 | A1 | 7/2012 | Hoentschel et al. | |

* cited by examiner

*Primary Examiner* — Nadine Norton
*Assistant Examiner* — Maki Angadi
(74) *Attorney, Agent, or Firm* — Amerson Law Firm, PLLC

(57) ABSTRACT

One illustrative method disclosed herein includes forming a structure above a semiconductor substrate, performing a conformal deposition process to form a layer of undoped spacer material above the structure, performing an angled ion implant process to form a region of doped spacer material in the layer of undoped spacer material while leaving other portions of the layer of undoped spacer material undoped, and, after performing the angled ion implant process, performing at least one etching process that removes the undoped portions of the layer of undoped spacer material and thereby results in a sidewall spacer comprised of the doped spacer material positioned adjacent at least one side, but not all sides, of the structure.

23 Claims, 4 Drawing Sheets

METHODS OF FORMING ASYMMETRIC SPACERS ON VARIOUS STRUCTURES ON INTEGRATED CIRCUIT PRODUCTS

BACKGROUND OF THE INVENTION

1. Field of the Invention

Generally, the present disclosure relates to the manufacture of sophisticated semiconductor devices, and, more specifically, to various methods of forming asymmetric spacers on a variety of different structures that may be formed on an integrated circuit product.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (FETs) represent one important type of circuit element that substantially determines performance of the integrated circuits. Field effect transistors are typically either NMOS devices or PMOS devices. During the fabrication of complex integrated circuits, millions of transistors, e.g., NMOS transistors and/or PMOS transistors, are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, referred to as a channel region, disposed between the highly doped source/drain regions. The channel length of a MOS transistor is generally considered to be the lateral distance between the source/drain regions.

In the manufacture of semiconductor devices, there is a constant drive to increase the operating speed of certain integrated circuit devices such, as microprocessors, memory devices and the like. As a result of the demand for increased speed, there has been a continual reduction in the size of semiconductor devices, such as transistors. For example, in a device such as a field effect transistor (FET), device parameters, such as channel length, junction depth and gate dielectric thicknesses, to name a few, all continue to be scaled downward. In general, the smaller the channel length of the FET, the faster the transistor will operate. Moreover, by reducing the size and/or scale of the components of a typical transistor, there is also an increase in the density and number of the transistors that may be produced on a given amount of wafer real estate, thus lowering the overall cost per transistor as well as the cost of integrated circuit devices incorporating such transistors.

Unfortunately, reducing the channel length of a transistor also increases "short channel" effects, as well as "edge effects" that are relatively unimportant in long channel transistors. One example of a short channel effect includes, among other aspects, an increased drain to source leakage current when the transistor is supposed to be in the "off" or non-conductive state, due to an enlarged depletion region relative to the shorter channel length. In addition, one of the edge effects that may also adversely influence transistor performance is what is known as Miller capacitance. The Miller capacitance is a parasitic overlap capacitance that arises as a result of the doped polycrystalline silicon gate electrode and gate dielectric that (almost invariably) overlaps with a conductive portion of the more heavily doped source/drain regions and/or the less heavily doped source/drain extension (SDE) regions (if present) of the FET.

Asymmetric spacers are used for various functions during semiconductor device manufacturing. For example, if differential offsets are needed for disparate doping requirements of source or drain areas near a gate structure, oftentimes asymmetric spacers are utilized to accomplish this offset. A commonly employed technique for the formation of asymmetric spacers utilizes multiple gate structure sidewall insulator layers and multiple implantations with numerous photoresist masking and etching processes to produce the desired offset. This technique is time-consuming, and the multiple masking and etching steps add to the manufacturing costs accordingly.

The present disclosure is directed to various methods of forming asymmetric spacers on a variety of different structures that may be formed on an integrated circuit product that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming asymmetric spacers on a variety of different structures that may be formed on an integrated circuit product. One illustrative method disclosed herein includes forming a structure above a semiconductor substrate, performing a conformal deposition process to form a layer of undoped spacer material above the structure, performing an angled ion implant process to form a region of doped spacer material in the layer of undoped spacer material while leaving other portions of the layer of undoped spacer material undoped, after performing the angled ion implant process, performing at least one etching process that removes the undoped portions of the layer of undoped spacer material and thereby results in a sidewall spacer comprised of the doped spacer material positioned adjacent at least one side, but not all sides, of the structure.

Another illustrative method disclosed herein includes forming a structure above a semiconductor substrate, performing a conformal deposition process to form a layer of undoped spacer material above the structure, performing an angled ion implant process with a dopant material comprised of one of boron difluoride, boron or carbon to form a region of doped spacer material in the layer of undoped spacer material comprising the dopant material while leaving other portions of the layer of undoped spacer material undoped, after performing the angled ion implant process, performing a first etching process that selectively removes the undoped portions of the layer of undoped spacer material while leaving the region of doped spacer material in position and performing a second anisotropic etching process to remove portions of the region of doped spacer material that are oriented in a direction that is substantially parallel to an upper surface of the substrate so as to thereby define a sidewall spacer comprised of the doped spacer material positioned adjacent at least one side, but not all sides, of the structure.

BRIEF DESCRIPTION OF THE DRAWINGS

The disclosure may be understood by reference to the following description taken in conjunction with the accompanying drawings, in which like reference numerals identify like elements, and in which.

Figure 1A:
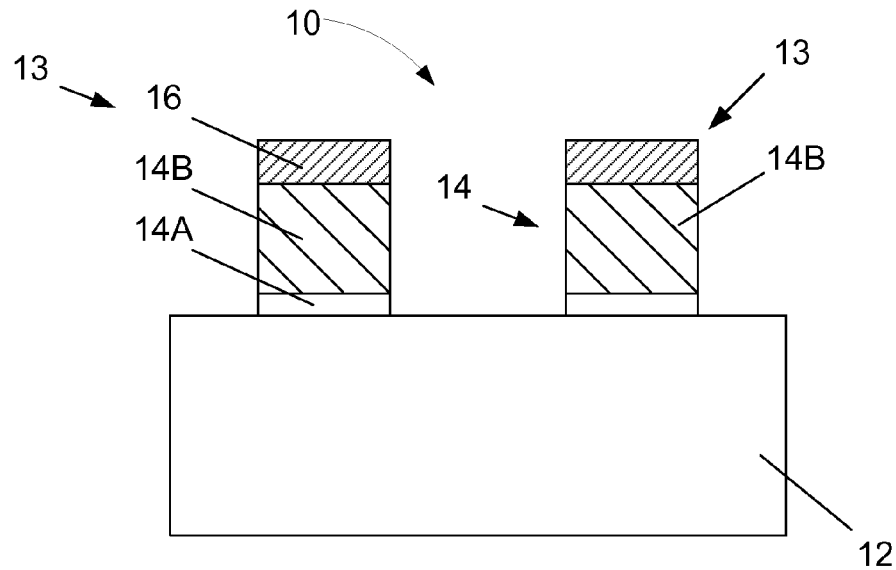
FIGS. 1A-1F depict various novel methods disclosed herein that may be used to form asymmetric spacers on a variety of different structures on an integrated circuit product.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming asymmetric spacers on a variety of different structures that may be formed on an integrated circuit product. As will be readily apparent to those skilled in the art upon a complete reading of the present application, the methods disclosed herein may be used in forming integrated circuit products that employ a variety of devices and technologies, e.g., NMOS, PMOS, CMOS, etc., and they may be readily employed in forming a variety of integrated circuit products, including, but not limited to, ASIC's, logic devices, memory devices, etc. With reference to the attached drawings, various illustrative embodiments of the methods disclosed herein will now be described in more detail.

FIG. 1A depicts an illustrative integrated circuit product or device 10 at an early stage of fabrication. The device 10 is formed in and above an illustrative semiconductor substrate 12. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein semiconductor devices are formed in and above the active layer. The substrate 12 may also be made of materials other than silicon. Thus, the terms "substrate" or "semiconductor substrate" should be understood to cover all forms of semiconductor structures and all semiconductor materials.

Also depicted in FIG. 1A are a plurality of illustrative structures 13 positioned above the substrate 12. The structures 13 depicted herein are intended to be schematic and representative in nature, as the size, shape, purpose, use, function, configuration and/or materials of construction used in the structures 13 may vary depending upon the particular application. In one illustrative embodiment, the structures 13 may be comprised of illustrative gate structures 14 for various transistor devices that will be formed in and above the substrate 12 or they may be residual portions of a hardmask layer. Such transistor structures would typically be electrically isolated by forming a trench isolation structure (not shown) in the substrate 12. In the depicted example, the structures 13 also include a gate cap layer 16. The illustrative gate structures 14 generally include an illustrative gate insulation layer 14A and one or more conductive gate electrode layers 14B. The gate cap layer 16, which may be made of a material such as silicon nitride, is positioned above each of the gate structures 14. The gate structures 14 depicted herein are intended to be schematic and representative in nature, as the materials of construction used in the gate structures 14 may be different depending upon the particular application. The gate insulation layer 14A may be comprised of a variety of materials, such as silicon dioxide, silicon oxynitride, a high-k (k value greater than 7) insulating material, etc. The gate electrode layer 14B may be comprised of one or more layers of conductive materials, such as polysilicon, amorphous silicon, a metal, etc. The structures 13 depicted in FIG. 1A may be formed by performing a variety of known techniques. For example, the layers of material that make up the structures 13 may be initially blanket-deposited above the substrate 12. Thereafter, one or more etching process are performed through a patterned mask layer (not shown) to define the basic structures 13 depicted in FIG. 1A.

Figure 1B:
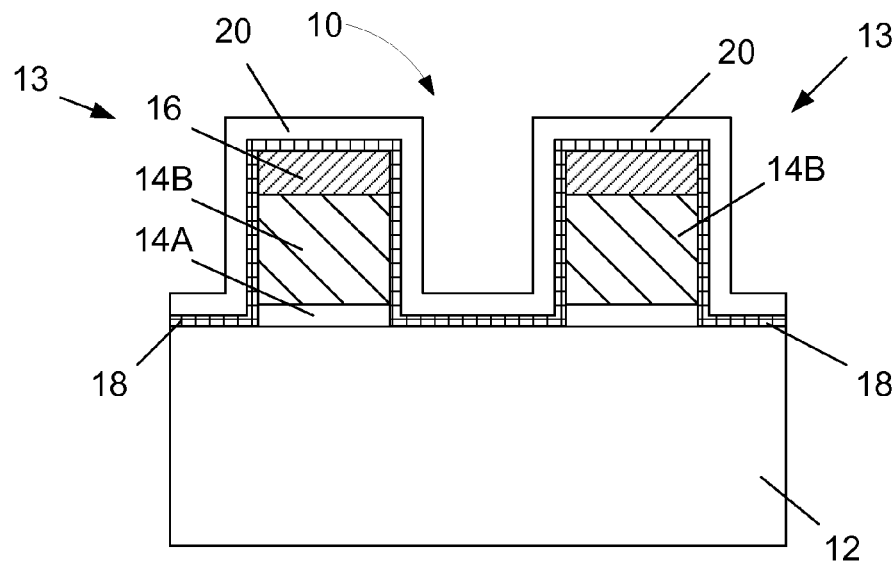

Next, as shown in FIG. 1B, a conformal deposition process may be performed to form an etch stop or protection liner 18 across the device 10. The protection liner 18 may be comprised of a variety of different materials, e.g., silicon dioxide, silicon nitride, etc., and it may be formed by performing, for example, a chemical vapor deposition (CVD) or atomic layer deposition (ALD) process. The thickness of the protection liner 18 may vary depending upon the particular application, e.g., about 1-3 nm. In some cases, the protection layer 18 may not be required.

Thereafter, with continuing reference to FIG. 1B, another conformal deposition process may be performed to form an undoped spacer material layer 20 on the protection layer 18. The undoped spacer material layer 20 may be comprised of a variety of different materials, e.g., undoped amorphous silicon, etc., and it may be formed by performing, for example, a CVD or ALD process. The thickness of the undoped spacer material layer 20 may vary depending upon the particular application, e.g., about 5-6 nm. It should be noted that, by referring to the spacer material layer 20 as being "undoped,"

it is only meant that no intentional steps have been taken to intentionally add dopant materials to the initially undoped spacer material layer 20.

Figure 1C:
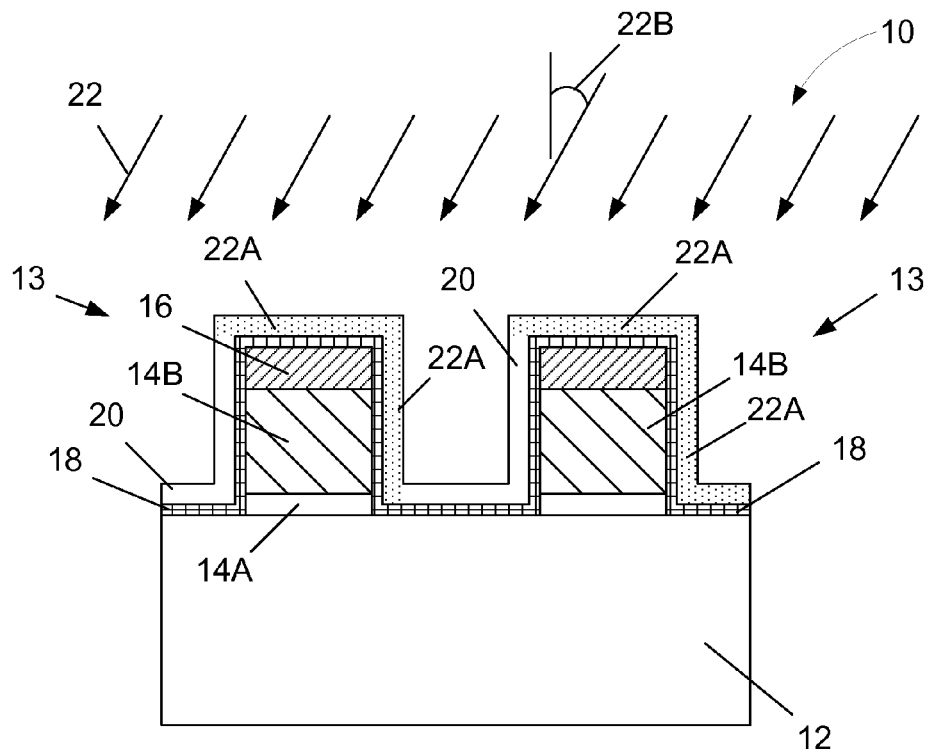

Next, as shown in FIG. 1C, an angled ion implantation process 22 is performed to form regions of doped spacer material 22A in portions of the undoped spacer material layer 20. Note that, due to the angle of the implant process 22, not all of the undoped spacer material layer 20 is implanted with the dopant material used in the implant process 22. The details of the ion implantation process 22, such as the material implanted, the implant dose, implant angle and implant energy, may vary depending on the particular application. In one illustrative embodiment, the angled ion implantation process 22 may be performed at an implant angle 22B that falls within the range of about 5-45 degrees. In one example, the angled ion implantation process 22 uses, for example, boron difluoride, boron or carbon, etc., at a dopant dose that ranges from about $1e^{14}$-$1e^{15}$ ions/cm$^2$, at an energy level that ranges from about 1-20 keV.

Figure 1D:
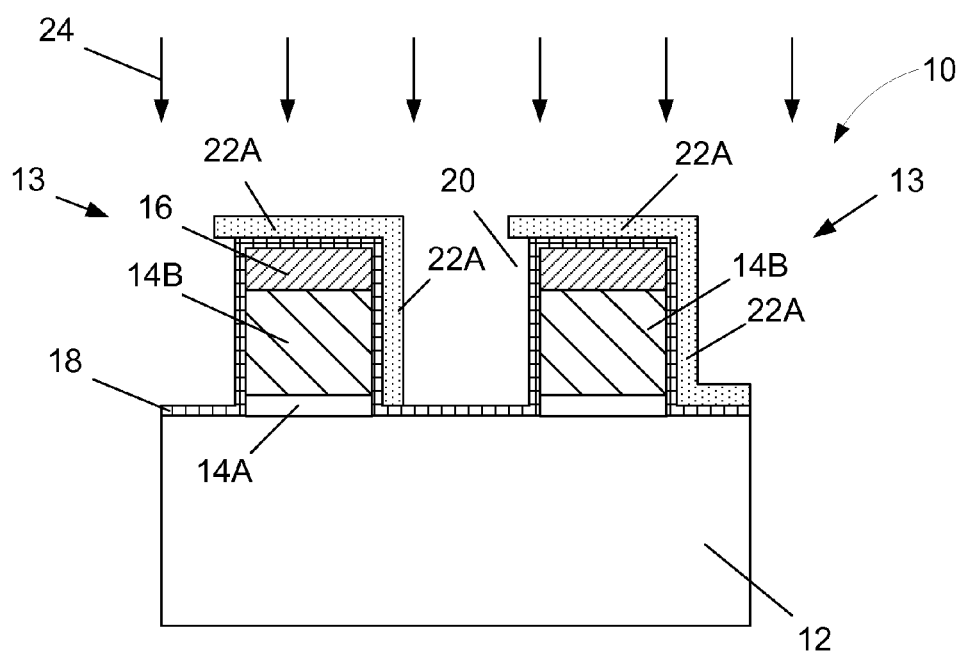

Then, as shown in FIG. 1D, an etching process 24 is performed to selectively remove the portions of the undoped spacer material layer 20 that were not implanted with the dopant materials during the angled ion implantation process 22. In general, the undoped portions of the undoped spacer material layer 20 will etch at a faster rate than the regions of doped spacer material 22A. During the etching process 24, the protection liner 18 protects the structures 13 and the substrate 12. In one illustrative embodiment, the etching process 24 may be a wet etching process that is performed with an etchant such as, for example, ammonia, KOH or TMAH.

Figure 1E:
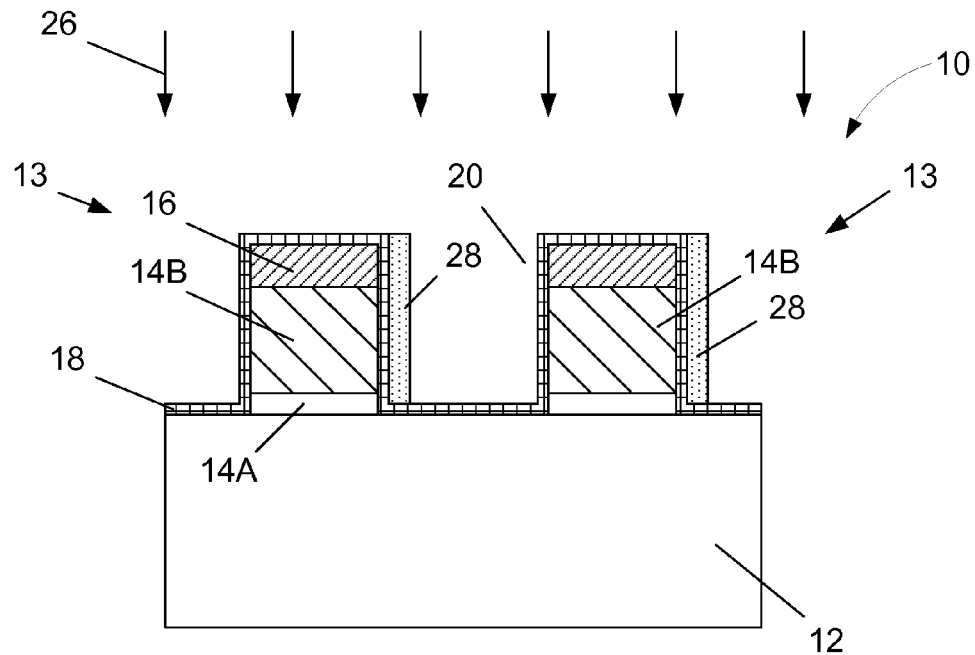

Then, as shown in FIG. 1E, an anisotropic etching process 26, such as a dry reactive ion etching process, is performed to remove the horizontally positioned portions of the remaining regions of doped spacer material 22A. This etching process results in the definition of the asymmetric spacers 28 comprised of the doped spacer material positioned adjacent one side of the structures 13. Depending upon the particular application, the spacer 28 may or may not actually contact the structure 13.

Figure 1F:
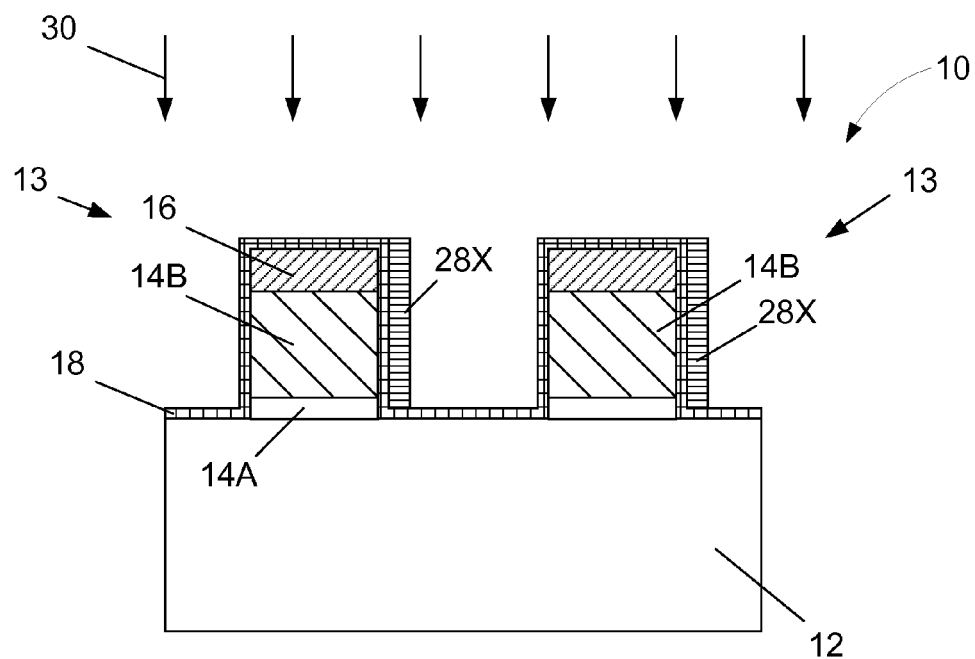

FIG. 1F depicts an optional process operation that may be performed to convert the spacer 28 to an oxide material. More specifically, in the case where the spacer 28 is made of a doped amorphous silicon, a heating process 30 may be performed to convert a portion or all of the spacer 28 to an oxide material 28X (complete conversion is depicted in FIG. 1F). The parameters of the oxidizing heating process may vary depending upon the particular application and the available thermal budget. The heating process 30 may be performed in a rapid thermal anneal chamber or in a traditional furnace.

Figure 2A:
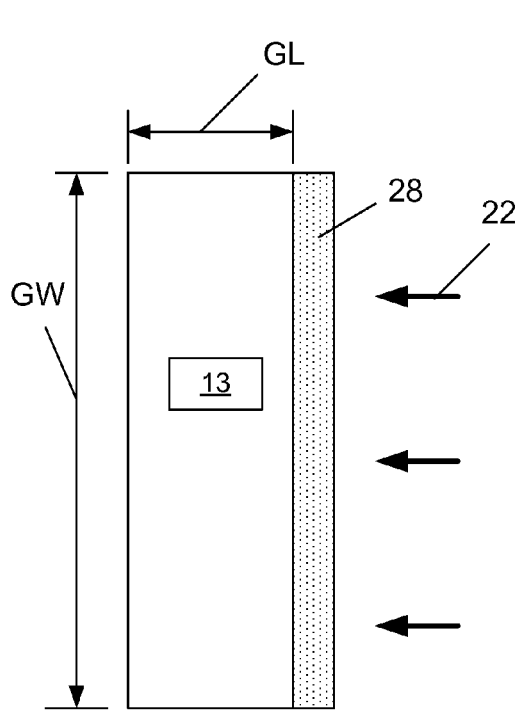
FIGS. 2A-2C depict various illustrative examples of the asymmetric spacer arrangement that may be formed using the novel method disclosed herein.
Figure 2B:
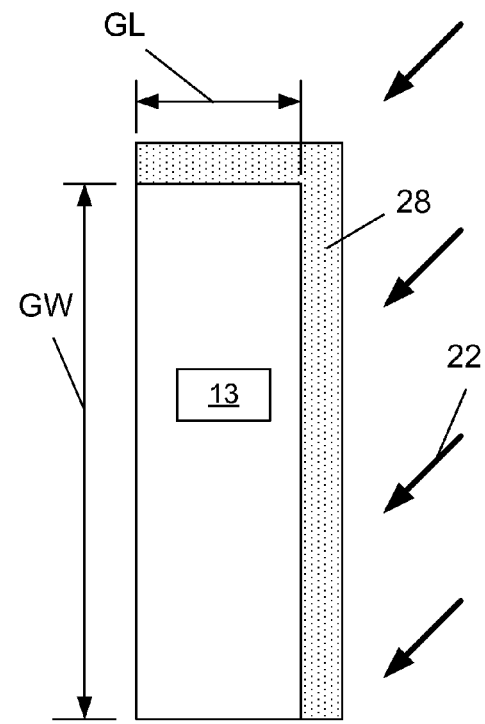
Figure 2C:
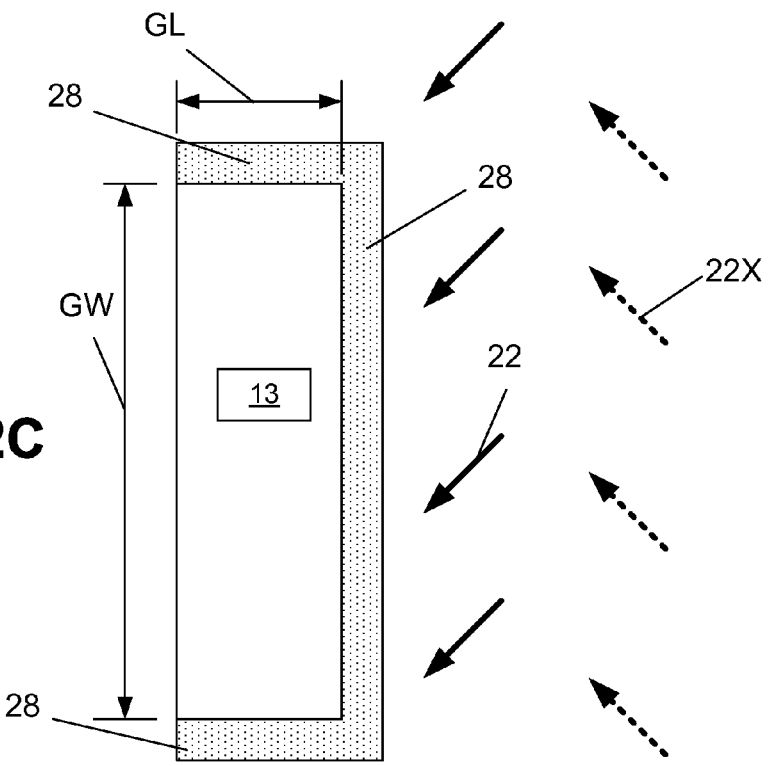

FIGS. 2A-2C are plan views depicting various illustrative examples of possible arrangements of one or more asymmetric spacers 28 that may be formed adjacent an illustrative structure 13 using the novel methods disclosed herein. In the illustrative embodiments shown in FIGS. 2A-2C, the structure 13 may be a gate electrode structure for a transistor that extends in a gate width (GW) and gate length (GL) direction. In the embodiment shown in FIG. 2A, a single angled ion implantation process 22 was performed in the direction indicated that, with the other processing described above, resulted in a single asymmetric spacer 28 positioned adjacent to only one side of the structure 13. In the embodiment shown in FIG. 2B, a single angled ion implantation process 22 was performed in the direction indicated that, with the other processing described above, resulted in asymmetric spacers 28 positioned adjacent to only two sides of the structure 13. In the embodiment shown in FIG. 2C, first and second angled ion implantation processes 22, 22X were performed in the directions indicated that, with the other processing described above, resulted in asymmetric spacers 28 positioned adjacent to only three sides of the structure 13. From the foregoing, it should be clear that the novel methods disclosed herein provide device designers with great flexibility in terms of forming asymmetric spacers at specific locations adjacent to selected portions of a structure formed when forming an integrated circuit product.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a structure above a semiconductor substrate;
   performing a conformal deposition process to form a layer of undoped spacer material above said structure;
   performing an angled ion implant process to form a region of doped spacer material in said layer of undoped spacer material while leaving other portions of said layer of undoped spacer material undoped; and
   after performing said angled ion implant process, performing at least one etching process that removes said undoped portions of said layer of undoped spacer material and thereby results in a sidewall spacer comprised of said doped spacer material positioned adjacent at least one side, but not all sides, of said structure.

2. The method of claim 1, further comprising, prior to forming said layer of undoped spacer material, forming a protection layer on said structure and said substrate, said layer of undoped spacer material being formed on said protection layer.

3. The method of claim 1, wherein said layer of undoped spacer material is comprised of undoped amorphous silicon.

4. The method of claim 1, wherein said angled ion implant process is performed at an angle that falls within the range of about 5-45 degrees relative to a line normal to an upper surface of said substrate.

5. The method of claim 1, wherein said angled ion implant process is performed using one of boron difluoride, boron or carbon.

6. The method of claim 1, wherein said angled ion implant process is performed using a dopant dose that ranges from about $1e^{14}$-$1e^{15}$ ions/cm$^2$ and at an energy level that ranges from about 1-20 keV.

7. The method of claim 1, further comprising performing a heating process to convert at least a portion of said sidewall spacer to an oxide material.

8. The method of claim 7, wherein said heating process is performed in one of a furnace or an RTA chamber.

9. The method of claim 1, wherein performing at least one etching process comprises:
   performing a first etching process that selectively removes said undoped portions of said layer of undoped spacer material while leaving said region of doped spacer material in position; and
   performing a second anisotropic etching process to remove portions of said region of doped spacer material so as to thereby define said sidewall spacer.

10. The method of claim 1, wherein said structure comprises a gate electrode structure for a transistor.

11. The method of claim 1, wherein said sidewall spacer is positioned adjacent only one side of said structure.

12. The method of claim 1, wherein said sidewall spacer is positioned adjacent only two sides of said structure.

13. The method of claim 1, further comprising performing an additional angled ion implant process, wherein said sidewall spacer is positioned adjacent only three sides of said structure.

14. A method, comprising:
forming a structure above a semiconductor substrate;
performing a conformal deposition process to form a layer of undoped spacer material above said structure;
performing an angled ion implant process with dopant material comprised of one of boron difluoride, boron or carbon to form a region of doped spacer material comprising said dopant material in said layer of undoped spacer material while leaving other portions of said layer of undoped spacer material undoped;
after performing said angled ion implant process, performing a first etching process that selectively removes said undoped portions of said layer of undoped spacer material while leaving said region of doped spacer material in position; and
performing a second anisotropic etching process to remove portions of said region of doped spacer material that are oriented in a direction that is substantially parallel to an upper surface of said substrate so as to thereby define a sidewall spacer comprised of said doped spacer material positioned adjacent at least one side, but not all sides, of said structure.

15. The method of claim 14, further comprising, prior to forming said layer of undoped spacer material, forming a protection layer on said structure and said substrate, said layer of undoped spacer material being formed on said protection layer.

16. The method of claim 14, wherein said layer of undoped spacer material is comprised of undoped amorphous silicon.

17. The method of claim 14, wherein said angled ion implant process is performed at an angle that falls within the range of about 5-45 degrees relative to a line normal to an upper surface of said substrate.

18. The method of claim 14, wherein said angled ion implant process is performed using a dopant dose that ranges from about $1e^{14}$-$1e^{15}$ ions/cm$^2$ and at an energy level that ranges from about 1-20 keV.

19. The method of claim 14, further comprising performing a heating process to convert at least a portion of said sidewall spacer to an oxide material.

20. A method, comprising:
forming a structure above a semiconductor substrate;
performing a conformal deposition process to form a layer of undoped spacer material above said structure, wherein said layer of undoped spacer material is comprised of undoped amorphous silicon;
performing an angled ion implant process with dopant material comprised of one of boron difluoride, boron or carbon to form a region of doped spacer material comprising said dopant material in said layer of undoped spacer material while leaving other portions of said layer of undoped spacer material undoped, wherein said angled ion implant process is performed at an angle that falls within the range of about 5-45 degrees relative to a line normal to an upper surface of said substrate and using a dopant dose that ranges from about $1e^{14}$-$1e^{15}$ ions/cm$^2$;
after performing said angled ion implant process, performing a first etching process that selectively removes said undoped portions of said layer of undoped spacer material while leaving said region of doped spacer material in position; and
performing a second anisotropic etching process to remove portions of said region of doped spacer material that are oriented in a direction that is substantially parallel to an upper surface of said substrate so as to thereby define a sidewall spacer comprised of said doped spacer material positioned adjacent at least one side, but not all sides, of said structure.

21. The method of claim 20, further comprising, prior to forming said layer of undoped spacer material, forming a protection layer on said structure and said substrate, said layer of undoped spacer material being formed on said protection layer.

22. The method of claim 20, wherein said angled ion implant process is performed at an energy level that ranges from about 1-20 keV.

23. The method of claim 20, further comprising performing a heating process to convert at least a portion of said sidewall spacer to an oxide material.

* * * * *